(12) United States Patent
Fujimura et al.

(10) Patent No.: US 10,568,212 B2
(45) Date of Patent: Feb. 18, 2020

(54) MANUFACTURING METHOD FOR MULTI-LAYER PRINTED CIRCUIT BOARD

(71) Applicant: ZEON CORPORATION, Tokyo (JP)

(72) Inventors: Makoto Fujimura, Tokyo (JP); Takashi Iga, Tokyo (JP); Akihiro Tanabe, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 413 days.

(21) Appl. No.: 15/528,081

(22) PCT Filed: Nov. 26, 2015

(86) PCT No.: PCT/JP2015/005871
§ 371 (c)(1),
(2) Date: Oct. 20, 2017

(87) PCT Pub. No.: WO2016/084375
PCT Pub. Date: Jun. 2, 2016

(65) Prior Publication Data
US 2018/0184525 A1    Jun. 28, 2018

(30) Foreign Application Priority Data
Nov. 28, 2014 (JP) ................................. 2014-242266

(51) Int. Cl.
 H05K 3/00 (2006.01)
 B23K 26/382 (2014.01)
 H05K 1/03 (2006.01)
 H05K 3/46 (2006.01)

(52) U.S. Cl.
 CPC ......... *H05K 3/0032* (2013.01); *B23K 26/382* (2015.10); *H05K 1/0373* (2013.01); *H05K 3/4644* (2013.01); *H05K 2203/107* (2013.01)

(58) Field of Classification Search
 CPC .. H05K 3/0032; H05K 3/0035; H05K 3/4673; H05K 1/0373; Y10T 29/49165; Y10T 29/49126
 See application file for complete search history.

(56) References Cited

U.S. PATENT DOCUMENTS

| | | | |
|---|---|---|---|
| 2004/0067348 A1 | 4/2004 | Nishii | |
| 2014/0034373 A1 | 2/2014 | Yoshikawa et al. | |
| 2014/0299356 A1 | 10/2014 | Zhang et al. | |

FOREIGN PATENT DOCUMENTS

| | | | | |
|---|---|---|---|---|
| CN | 1465218 A | 12/2003 | | |
| CN | 1794902 A | 6/2006 | | |
| CN | 1996562 A | 7/2007 | | |
| CN | 101583489 A | 11/2009 | | |
| EP | 1168900 A1 | 1/2002 | | |
| EP | 1408726 A1 | 4/2004 | | |
| EP | 1137333 B1 | 4/2010 | | |
| JP | 10-041628 A | 2/1998 | | |
| JP | 2010-41628 A | 2/1998 | | |
| JP | 2001-308536 A | 11/2001 | | |
| JP | 2004308536 A | 11/2001 | | |
| JP | 2003-306649 A | 10/2003 | | |
| JP | 2004-343086 A | 12/2004 | | |
| JP | 2005-51263 A | 2/2005 | | |
| JP | 2012-174710 A | 9/2012 | | |
| JP | 2013-80757 A | 5/2013 | | |
| JP | 2013-135032 A | 7/2013 | | |
| JP | 2013-197231 A | 9/2013 | | |
| JP | 2014-060455 A | 4/2014 | | |
| JP | 2014060455 A | 4/2014 | | |
| TW | 558931 B | 10/2003 | | |
| TW | 201320849 A1 | 5/2013 | | |
| WO | 03/09660 A1 | 1/2003 | | |
| WO | 2009/066759 A1 | 5/2009 | | |
| WO | WO-2009066759 A1 * | 5/2009 | ........... | H05K 3/0032 |
| WO | 2013/145043 A1 | 10/2013 | | |
| WO | 2014/109593 A1 | 7/2014 | | |

OTHER PUBLICATIONS

Japan Patent Office, PCT International Search Report for PCT Counterpart Application No. PCT/JP2015/005871 with English translation, 3 pgs. (dated Mar. 1, 2016).
Japan Patent Office, PCT Written Opinion of the International Searching Authority for PCT Counterpart Application No. PCT/JP2015/005871, 3 pgs. (dated Feb. 18, 2016).
European Search Report and Search Opinion Received for EP Application No. 15862168.0, dated Sep. 10, 2018, 8 pages.

\* cited by examiner

*Primary Examiner* — Livius R. Cazan
(74) *Attorney, Agent, or Firm* — Womble Bond Dickinson (US) LLP; Joseph Bach, Esq.

(57) ABSTRACT

The present invention enables the manufacture of a small-sized high-density multi-layer printed circuit board. The manufacturing method for a multi-layer printed circuit board, according to the present invention, comprises: a step in which an electrical insulation layer is formed by heating a laminate comprising a substrate, a heat-curable resin composition layer provided on the substrate, and a release substrate provided on the heat-curable resin composition layer, thereby curing the heat-curable resin composition layer, and a step in which a via hole is formed in the electrical insulation layer by irradiating a laser from above the release substrate. In addition, in the present invention, the release substrate has a thickness of at least 80 μm and is formed using a material having a glass transition temperature, the heat-curable resin composition layer has a volatile component-content of 7.0 mass % or less and a thickness of 25 μm or less, and the curing of the heat-curable resin composition layer occurs at a temperature that is not less than the glass transition temperature of the material of the release substrate.

5 Claims, No Drawings

US 10,568,212 B2

MANUFACTURING METHOD FOR MULTI-LAYER PRINTED CIRCUIT BOARD

FIELD

The present invention relates to a method for manufacturing a multi-layer printed wiring board.

BACKGROUND

In recent years, there has arisen a demand for circuit boards used in electronic devices to support ever greater density in conjunction with the pursuit of making electronic devices smaller, multi-functional, and capable of high-speed communication, and thus printed wiring boards having multi-layer structures (hereinafter referred to as "multi-layer printed wiring boards") are being used to meet the demand for this greater density.

Furthermore, this type of multi-layer printed wiring board is formed, for example, by laminating an electrical insulating layer on an inner layer substrate formed using a core substrate, formed by forming electrical insulating layers on both sides of substrates, and a conductive layer (wiring layer), formed on a surface of the core substrate, and then, after forming the conductive layer on the electrical insulating layer, repeatedly laminating electrical insulating layers and forming conductive layers on a substrate formed by forming electrical insulating layers and conductive layers, in that order, on the inner layer substrate. Moreover, a variety of vias (for example, blind vias, buried vias, through hole vias, and the like) are formed in multi-layer printed wiring boards, which vias electrically connect conductive layers, mutually separated from one another in a laminating direction, to one another. Additionally, for example, a via is formed by forming a hole for a via in a substrate using a laser process, and the like, removing smears (de-smearing) of residual resin, and the like, generated by the forming of the hole, and then, forming a conductor in the hole.

To achieve smaller and denser multi-layer printed wiring boards, via formation requires smaller via hole diameters and better via connection reliability. Thus, for example, a method for forming a blind via with a top diameter of 100 or less by irradiating a carbon dioxide gas laser onto an electrical insulating layer formed on a substrate from above a 20 to 50 μm thick plastic film adhering to a surface of the electrical insulating layer is disclosed in Patent Document 1. According to the method disclosed in Patent Document 1, a blind via with high connection reliability, and where a difference between a via bottom diameter and top diameter is small, can be formed without generating significant unevenness on a surface of an electrical insulating layer around the via.

PRIOR ART DOCUMENTS

Patent Documents

Patent Document 1: WO 2009/066759

SUMMARY

However, the technique disclosed in Patent Document 1 left room for improvement in the form of giving a via an even smaller diameter by making a diameter of a hole for the via, formed using a laser process, even smaller.

Therefore, as a result of intense study with the object of giving the hole for the via an even smaller diameter, the inventors discovered that, because laser processing forms tapered holes with smaller diameters on the bottom sides thereof, it was obvious that the hole for the via to be formed could be given an adequately small diameter by performing the laser processing in a state where a releasable substrate (hereinafter referred to as a "release substrate") at least 80 μm thick is adhered onto an electrical insulating layer.

However, after further research, it also became obvious to the inventors that, when an electrical insulating layer is formed by curing a heat-curable resin composition layer made from a heat-curable resin composition, if a release substrate at least 80 μm thick, formed using a material having a glass transition point, is used, and, an electrical insulating layer—to which the release substrate has been adhered by curing the heat-curable resin composition layer, to which the release substrate is adhered, at a temperature at or above the glass transition point of the material of the release substrate—is formed, heat resistance of the electrical insulating layer will drop such that swelling will occur during heating from soldering, and the like.

Therefore, an object of the present invention is to enable the manufacture of a small, high-density multi-layer printed wiring board by providing a technique for making a diameter of a hole for a via adequately small while suppressing a drop in heat resistance of an electrical insulating layer.

The inventors engaged in intense study to achieve the aforementioned object. Furthermore, the inventors completed the invention through the discovery that a drop in the heat resistance of an electrical insulating layer can be suppressed, even when a release substrate at least 80 μm thick, formed using a material having a glass transition point is used, and an electrical insulating layer—to which the release substrate has been adhered by curing the heat-curable resin composition layer, to which the release substrate is adhered, at a temperature at or above the glass transition point of the material of the release substrate—is formed, by keeping an amount of a volatile component included in the heat-curable resin composition layer at or below a prescribed amount, and by keeping a thickness of the heat-curable resin composition layer to no more than a prescribed thickness.

That is, whereas an object of the present invention is to resolve the problems described above, the method for manufacturing the multi-layer printed wiring board according to the present invention is a method for manufacturing a multi-layer printed wiring board having a via, and includes; a step for forming an electrical insulating layer by heating a laminate provided with a substrate, a heat-curable resin composition layer provided on the substrate, and a release substrate provided on the heat-curable resin composition layer, thereby curing the heat-curable resin composition layer; and a step for forming a hole for a via in the electrical insulating layer by irradiating a laser from above the release substrate; where the release substrate is at least 80 μm thick and is formed using a material having a glass transition point, the heat-curable resin composition layer contains no more than 7.0 wt % a volatile component and is no more than 25 μm thick, and the curing of the heat-curable resin composition layer occurs at a temperature that is equal to or greater than the glass transition point. Because a small diameter hole for a via can be formed by irradiating a laser from above a release substrate at least 80 μm thick, the diameter of the via can be made small, which thus enables the manufacture of a small, high-density multi-layer printed wiring board. Furthermore, as long as the amount of the volatile component contained in the heat-curable resin composition layer is kept to no more than 7.0 wt % and the thickness of the layer is kept to no more than 25 µm, swelling generated during heating can be suppressed by suppressing a drop in the heat resistance of the electrically insulating layer, even when a release substrate thickness of at least 80 µm is used and the electrical insulating layer is formed by curing the heat-curable resin composition layer at a temperature at or above the glass transition point of the material of the release substrate.

Note that, in the present invention, "release substrate thickness" indicates an average of thickness values measured in five locations by opening a gap of at least 20 mm with respect to the release substrate. Furthermore, in the present invention, "heat-curable resin composition layer thickness" indicates an average of thickness values measured at five locations by opening a gap of at least 20 mm with respect to the heat-curable resin composition layer. Moreover, in the present invention, the "amount of volatile component contained" can be derived from a loss of weight from when the heat-curable resin composition is air dried at 170° C. for 30 minutes, and the "glass transition point" can be derived using a dynamic viscoelastic analysis (DMA) method.

Furthermore, in the method for manufacturing a multi-layer printed wiring board according to the present invention, the heat-curable resin composition layer includes an epoxy resin, and it is preferable that the epoxy resin include a ratio of at least 20 wt % of an epoxy compound that is in a liquid state under normal temperature and normal pressure. As long as an epoxy resin including a ratio of at least 20 wt % of an epoxy compound that is in a liquid state under normal temperature and normal pressure is used, an amount of a solvent used when the heat-curable resin composition layer is formed can be reduced because the amount of volatile component contained in the heat-curable resin composition layer can be easily reduced.

Note that, in the present invention, "in a liquid state under normal temperature and normal pressure," indicates being in a liquid state at a temperature of 20° C. and an atmospheric pressure of 1 µm.

It is preferable that the heat-curable resin composition layer in the multi-layer printed wiring board according to the present invention include at least 50 wt % of an inorganic filler. It is also preferable that the heat-curable resin composition layer include a polyphenylene ether compound.

Furthermore, it is preferable that the diameter of the hole formed in the electrical insulating layer by the method for manufacturing a multi-layer printed wiring board according to the present invention be no more than 30 µm.

Note that the "diameter of the hole formed in the electrical insulating layer" can be derived by measuring an opening diameter of a hole formed in the electrical insulating layer using an electron microscope after the release substrate has been peeled off.

According to the present invention, a small, high-density multi-layer printed wiring board can be manufactured because a hole for a via having a small diameter can be formed while suppressing a drop in a heat resistance of an electrical insulating layer.

DETAILED DESCRIPTION

The method for manufacturing a multi-layer printed wiring board according to the present invention is used to manufacture a multi-layer printed wiring board having an electrical insulating layer and a conductive layer that have been laminated together, and a via for electrically connecting conductive layers separated from one another in a laminating direction. Furthermore, the method for manufacturing a multi-layer printed wiring board according to the present invention is characterized in that the method performs the formation of the electrical insulating layer in which a hole for the via is formed, and the formation of the hole in the electrical insulating layer, under prescribed conditions.

Embodiments of the present invention are described in detail below.

(Method for Manufacturing a Multi-Layer Printed Wiring Board)

Here, in an embodiment of the method for manufacturing a multi-layer printed wiring board according to the present invention, a multi-layer printed wiring board, where a prescribed number of electrical insulating layers and conductive layers have been laminated together, is manufactured by repeatedly implementing the formation of electrical insulating layers, and then the formation of conductive layers on the electrical insulating layers, with respect to an inner layer substrate formed by sequentially laminating electrical insulating layers and then conductive layers on a substrate. Furthermore, in one embodiment of the method for manufacturing a multi-layer printed wiring board according to the present invention, a via forming step, involving a step for forming a hole for a via, a step for removing smearing generated when the hole is formed, and a step for forming a conductor in the hole, is executed at least once to provide a via, such as a blind via, a buried via, or a through hole via in the multi-layer printed wiring board.

Moreover, in an embodiment of the method for manufacturing a multi-layer printed wiring board according to the present invention, the formation of the electrical insulating layer in which the hole for the via is formed, and the formation of the hole in the electrical insulating layer, are performed as follows. That is, the electrical insulating layer, in which the hole for the via is formed, is formed by heating a laminate made from; a substrate having an electrical insulating layer and a conductive layer laminated together; a heat-curable resin composition layer, made from a heat-curable resin composition, provided on the substrate; and a release substrate provided on the heat-curable resin composition layer, and then curing the heat-curable resin composition layer. Additionally, a heat-curable resin composition layer at least 25 µm thick containing an amount of a volatile component of no more than 7.0 wt %, and a release substrate at least 80 µm thick formed using a material having a glass transition point, are used when forming the electrical insulating layer in which the hole for the via is formed. Moreover, the heat-curable resin composition layer is cured at a temperature at or above the glass transition point of the material of the release substrate. Furthermore, the hole for the via is formed in the electrical insulating layer formed as described above by irradiating a laser from above the release substrate before peeling the release substrate.

Because a tapered hole with a small diameter on a bottom side is formed so as to penetrate through a release substrate on an electrical insulating layer, and through the electrical insulating layer, so long as a laser process is performed by irradiating a laser from above a release substrate at least 80 µm thick, the diameter of the hole formed in the electrical insulating layer can be made smaller than that of a hole formed when a release substrate is not used. Moreover, as a result, a via can be given a small diameter thus enabling the manufacture of a small, high-density multi-layer printed wiring board. Furthermore, as long as the amount of the volatile component contained in the heat-curable resin composition layer is kept at or below 7.0 wt % and the thickness of the layer is kept to no more than 25 μm, it is possible to keep large amounts of a volatile component in the heat-curable resin composition layer from being confined in the layer by the release substrate, even when a release substrate at least 80 μm thick is used and the electrical insulating layer is formed by curing the heat-curable resin composition layer at a temperature at or above the glass transition temperature of the material of the release substrate. Accordingly, the heat resistance (especially resistance to soldering heat) of the electrical insulating layer can be kept from dropping, which makes it possible to suppress swelling generated during heating, such as during soldering, and the like.

<Substrate>

The substrate for the inner layer substrate for laminating the electrical insulating layer and the conductive layer is not particularly limited, and thus any known substrate used in manufacturing multi-layer printed wiring boards can be used. Specific examples include electrical insulating substrates, printed wiring boards, printed circuit boards, and the like. Note that electrical insulating substrates can be formed by curing resin compositions containing electrical insulating materials such as, for example, alicyclic olefin polymers, epoxy resins, maleimide resins, acrylic resins, methacrylic resins, diallyl phthalate resins, triazine resins, polyphenylene ether resins, polyimide resins, whole aromatic polyester resins, glass, and the like.

<Electrical Insulating Layer>

Additionally, examples of electrical insulating layers for multi-layer printed wiring boards include layers (insulating resin layers) made from cured products obtained by curing curable resin compositions. Specific examples of electrical insulating layers include single-layer structure or multi-layer structure insulating resin layers obtained by curing single-layer or multi-layer curable resin composition layers formed using curable resin compositions.

<Formation of Electrical Insulating Layer in which a Hole for a Via is Formed>

In an embodiment of the method for manufacturing a multi-layer printed circuit board according to the present invention, an electrical insulating layer, in which a hole for a via is formed, is formed by curing a heat-curable resin composition layer no more than 25 μm thick containing no more than 7.0 wt % of a volatile component under prescribed conditions. Specifically, an electrical insulating layer with a release substrate adhered to a surface thereof is formed on a substrate by heating a laminate—provided with a substrate, a heat-curable resin composition layer provided on the substrate, and a release substrate provided on the heat-curable resin composition layer—under prescribed conditions to cure the heat-curable resin composition layer.

Note that the laminate provided with a substrate, a heat-curable resin composition layer, and a release substrate may be formed by sequentially laminating a heat curable resin composition and the release substrate on a substrate, in that order, or by forming the heat-curable resin composition layer, with the release substrate as a support, and then, laminating the release substrate and the heat-curable resin composition layer to a substrate such that the heat-curable resin composition layer is on the inside. From the perspective of manufacturability, of the two, it is preferable that the laminate be formed by forming the heat-curable resin composition layer, with the release substrate as a support, and then, laminating the release substrate and the heat-curable resin composition layer to a substrate using means, such as heat crimping, and the like.

[Substrate]

Thus, a substrate formed by sequentially laminating an electrical insulating layer and a conductive layer on a substrate, in that order, can be used as the substrate.

[Heat-Curable Resin Composition Layer]

Furthermore, except for keeping a contained amount of a volatile component to no more than 7.0 wt % and thickness to no more than 25 μm, there are no particular limitations on the heat-curable resin composition layer, and thus, examples thereof include heat-curable resin composition layers formed using any heat-curable resin composition known to be used in the manufacture of multi-layer printed wiring boards. Specifically, a heat-curable resin composition layer containing a curable resin and a curing agent, and also containing any filler or polyphenylene ether compound, can be used as the heat-curable resin composition layer.

[Volatile Component]

Here, examples of the volatile component included in the heat-curable resin composition layer include the volatile components included in the heat-curable resin composition used to form the heat-curable resin composition layer. Specific examples of the volatile component include solvents left behind in heat-curable resin composition layers when heat-curable resin composition layers are formed by drying heat-curable resin compositions including solvents. Note that while the solvents are not particularly limited, examples include organic solvents, such as toluene, anisole, propylene glycol monomethyl ethers, and the like.

Furthermore, the heat-curable resin composition layer should contain no more than 7.0 wt % of the volatile component, and it is preferable that the amount of the volatile component contained in the heat-curable resin composition layer be no more than 6.8 wt %, with no more than 6.5 wt % being more preferable. This due to the fact that if the amount of the volatile component contained in the heat-curable resin composition layer exceeds 7.0 wt % when the heat-curable resin composition layer is cured to form the electrical insulating layer in a state where a release substrate at least 80 μm thick is positioned on the heat-curable resin composition layer, the heat resistance of the electrical insulating layer will drop, causing swelling to occur during soldering, and the like. Note that the amount of the volatile component contained in the heat-curable resin composition layer can be adjusted by adjusting the forming conditions (for example, the composition, contained amount of the volatile component, and drying conditions of the heat-curable resin composition used to form the heat-curable resin composition layer) for the heat-curable resin composition layer. Furthermore, from the perspective of the formability of the heat-curable resin composition layer, the amount of the volatile component contained in the heat-curable resin composition layer is normally at least 1.0 wt %.

[Curable Resin]

The curable resin is not particularly limited so long as the resin displays heat-curability when combined with a curing agent and has electrical insulating properties, and examples include epoxy resins, maleimide resins, acrylic resins, methacrylic resins, diallyl phthalate resins, triazine resins, alicyclic olefin polymers, aromatic polyether polymers, benzocyclobutene polymers, cyanate ester polymers, polyimides, and the like. These resins can each be used independently or by combining two or more types thereof.

Among the examples mentioned above, epoxy resins or alicyclic olefin polymers having polar groups are preferable, with epoxy resins being more preferable. Furthermore, from the perspective of reducing the amount of solvent used in the preparation of the heat-curable resin composition used in the formation of the heat-curable resin composition layer to easily reduce the amount of the volatile component contained in the heat-curable resin composition layer, it is preferable that the curable resin contain a component that is in a liquid state under normal temperature and normal pressure, and it is more preferable that the resin contain at least 20 wt % of the component that is in a liquid state under normal temperature and normal pressure.

Note that a mixture including; a polyvalent epoxy compound having a biphenyl structure and/or a condensed polycyclic structure; an epoxy compound containing a trivalent or higher polyvalent glycidyl group (excluding compounds corresponding to polyvalent epoxy compounds having a biphenyl structures and/or a condensed polycyclic structures); and a phenolic resin containing a triazine structure, is preferred as the epoxy resin.

Additionally, an epoxy resin containing an epoxy compound that is in a liquid state under normal temperature and normal pressure is preferable as the epoxy resin, with an epoxy resin containing at least 20 wt % of the epoxy compound that is in a liquid state under normal temperature and normal pressure being more preferable. Note here that while the epoxy compound that is in a liquid state under normal temperature and normal pressure is not particularly limited, examples include glycidyl amine type epoxy compounds such as tetravalent glycidyl amine type epoxy compounds with the trade names "YH-434 and YH-434L" (and others, manufactured by Nippon Steel & Sumikin Chemical Co., Ltd.) and "jER604" (manufactured by Mitsubishi Chemical Corporation); compounds containing polyvalent glycidyl groups obtained by glycidylating a trivalent or higher compound having a phenol structure or an aminophenyl structure in the same molecule such as trivalent glycidyl amine type epoxy compounds with the trade name "jER630" (manufactured by Mitsubishi Chemical Corporation); bisphenol A type epoxy compounds with the trade names "jER827, jER828, jER828EL, jER828XA, and jER834" (and others, manufactured by Mitsubishi Chemical Corporation), and "EPICLON 840, EPICLON 840-S, EPICLON 850, EPICLON 850-S, and EPICLON 850-LC" (and others, manufactured by Dainippon Ink & Chemicals, Inc., "EPICLON" is a Register Trademark); and phthalate type epoxy resins with the trade name "Deconol (Registered Trademark) EX-721" (Nagase ChemteX Corporation), and the like.

Furthermore, polymers having dycloalkane structures and, as polar groups, at least one type of functional group selected from a group consisting of an alcoholic hydroxyl group, a phenolic hydroxyl group, a carboxyl group, an alkoxyl group, an epoxy group, a glycidyl group, an oxycarbonyl group, a carbonyl group, an amino group, a carboxylic anhydride group, a sulfonic acid group, and a phosphate group, are preferable as the alicyclic olefin polymers having polar groups.

[Curing Agent]

Furthermore, any known compound that is able to cure a curable resin composition layer by reacting with a curing resin through heat can be used as the curing agent. While the specific curing agent is not particularly limited, an active ester compound, preferably an active ester compound having at least two active ester groups in a molecule, can be used as the agent in cases where the curing resin is, for example, an epoxy resin. Furthermore, while the curing agent is not particularly limited, a compound having two or more functional groups capable of forming a bond by reacting with a polar group of an alicyclic olefin polymer having a polar group can be used as the agent in cases where the curing resin is, for example, an alicyclic olefin polymer having a polar group.

Note that an active ester compound obtained from a product obtained by reacting a carboxylic acid compound and/or a thiocarboxylic acid compound with a hydroxy compound and/or a thiol compound is preferable, an active ester compound obtained from a product obtained by reacting a carboxylic acid compound with one or two or more compounds selected from a group consisting of a phenol compound, a naphthol compound and a thiol compound is more preferable, and an aromatic compound obtained from a reaction of a carboxylic acid compound and an aromatic compound having a phenolic hydroxyl group, and at least two active ester groups in a molecule, is even more preferable as the active ester compound.

Moreover, examples of the compound having two or more functional groups capable of forming a bond by reacting with a polar group include multivalent epoxy compounds, polyvalent isocyanate compounds, polyvalent amine compounds, multivalent hydrazide compounds, aziridine compounds, basic metal oxides, organometallic halides, and the like. One type of these may be used independently or two or more types may be used in combination. Furthermore, these compounds and peroxides may be used in combination as the curing agent.

[Filler]

Additionally, while either well known inorganic fillers or organic fillers capable of lowering the coefficient of linear expansion of the electrical insulating layer can be used as the filler, it is preferable to use inorganic fillers. Specific examples of inorganic fillers include calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, and the like. Note that the filler to be used may be surface-treated in advance using a silane coupling agent, or the like. Furthermore, it is preferable that the amount of the filler contained in the curable resin composition layer be at least 50 wt %. Note that in cases where the electrical insulating layer is made from a multi-layer insulating resin layer by curing a multi-layer curable resin composition layer, it is preferable that at least one of the multiple layers of the curable resin composition layer contain at least 50 wt % of the filler.

[Other Compounding Agents]

In addition to the components described above, a polyphenylene ether compound may be added to the heat-curable resin composition layer. Adding a polyphenylene ether compound both increases the heat resistance and reduces a dissipation factor of the electrical insulating layer formed using the curable resin composition. Furthermore, as long as the amount of the volatile component remains in the range of no more than 7.0 wt %, well-known additives, such as curing accelerators, flame retardants, flame retardant aids, heat stabilizers, weathering stabilizers, antioxidants, ultraviolet absorbers (laser processability improvers), leveling agents, anti-static agents, slip agents, anti-blocking agents, anti-fogging agents, lubricants, dyes, natural oils, synthetic oils, waxes, emulsions, magnetic materials, dielectric property regulators, toughness agents, and the like can be added to the heat-curable resin composition layer.

[Formation of the Heat-Curable Resin Composition Layer]

Moreover, while the method for forming the heat-curable resin composition layer on the substrate or release substrate when the laminate provided with a substrate, a heat-curable resin composition layer, and a release substrate is prepared is not particularly limited, it is preferable that the heat-curable resin composition layer obtained by mixing the components and, if desired, a solvent, such as an organic solvent, and the like, is spread, sprayed, or cast onto the substrate or the release substrate, and then dried.

To ensure that the contained amount of the volatile component is no more than 7.0 wt %, the heat-curable resin composition can be dried at a drying temperature of at least 20° C. but no more than 300° C., with at least 30° C. but no more than 200° C. being preferable. Furthermore, drying time can be at least 30 seconds but no more than one hour, with at least one minute but no more than 30 minutes being preferable.

When the release substrate and the heat-curable resin composition layer are laminated to the substrate using means such as heat crimping, and the like, after the heat-curable resin composition layer has been formed with the release substrate as a support, the temperature during the heat crimping operation can be at least 30° C. but no more than 250° C., with at least 70° C. but no more than 200° C. being preferable. Moreover, the pressure applied during the heat crimping process can be at least 10 kPa but no more than 20 MPa, with at least 100 kPa but no more than 10 MPa being preferable, and the heat crimping time can be at least 30 seconds but no more than five hours, with at least one minute but no more than three hours being preferable. Moreover, it is preferable that heat crimping be done under reduced pressure to suppress the generation of bubbles, and thus pressure at the time of heat crimping can be, for example, at least 1 Pa but no more than 100 kPa, with at least 10 Pa but no more than 40 kPa being preferable.

Note that the heat-curable resin composition layer may be uncured or semi-cured. Here, uncured means at state where all of the curable resin actually dissolves when the curable resin composition layer is soaked in a solvent capable of dissolving the curable resin used to prepare the heat-curable resin composition. Furthermore, semi-cured means a state of being cured part way to the degree that further heating would achieve curing, and thus, preferably, either a state where part (specifically, an amount that is at least 7 wt %, and, an amount such that part remains) of the curable resin capable of dissolving the cured resin used to prepare the heat-curable resin composition layer is dissolved, or a state where a volume after soaking the heat-curable resin composition layer in a solvent for 24 hours is at least 200% of the volume before soaking.

[Thickness of the Heat-Curable Resin Composition Layer]

Moreover, the thickness of the heat-curable resin composition layer must be no more than 25 μm, with no more than 20 μm being preferable. Furthermore, the thickness of the heat-curable resin composition layer is typically at least 3 μm. This is because, as long as the thickness of the heat-curable resin composition layer is no more than 25 μm, the total amount of the volatile component in the heat-curable resin composition layer can be sufficiently reduced, while the drop in the heat resistance of the electrical insulting layer and the generation of swelling during heating can both be suppressed. This is also because, as long as the thickness of the heat-curable resin composition layer is no more than 25 μm when a tapered hole with a small diameter bottom part is formed when the hole for the via is formed by the laser process, the diameter difference between an opening part and a bottom part of the hole can be made small, and thus the diameter of the hole for the via can be made sufficiently small. Note that when the thickness of the heat-curable resin composition layer is less than 3 μm, the thickness of the obtained electrical insulating layer is also too thin, giving the layer poor reliability as an electrical insulating layer.

[Release Substrate]

A member that is film-like, plate-shaped, or the like, at least 80 μm thick, and formed using a material having a glass transition point is used as the release substrate.

[Thickness of the Release Substrate]

Here, from the perspective of making the diameter of the hole for the via formed in the electrical insulating layer by irradiating a laser from above the release substrate sufficiently small, the thickness of the release substrate must be at least 80 μm, with at least 100 μm being preferable. Furthermore, from the perspective of keeping the volatile component in the heat-curable resin composition layer from becoming trapped in the electrical insulating layer when the heat-curable resin composition layer is cured to form the electrical insulating layer, the thickness of the release substrate is preferably no more than 200 μm, with no more than 150 μm being preferable. Note that when the release substrate is less than 80 μm thick, the heat resistance of the electrical insulating layer does not drop and swelling does not occur, even when the amount of the volatile component contained in the heat-curable resin composition layer exceeds 7.0 wt %.

[Release Substrate Material]

Moreover, the material used to form the release substrate is not particularly limited as long as the material has a glass transition point, and examples of the material include polymer compounds, such as polyethylene terephthalate, polypropylene, polyethylene, polycarbonate, polyethylene naphthalate, polyarylate, nylon, polytetrafluoroethylene, and the like, and glass, and the like. Any substance among these having a glass transition point of at least 70° C. but no more than 170° C. is preferable as the material used to form the release substrate, with polyethylene terephthalate being more preferable.

Note that, as long as the release substrate has a layer formed using a material having the glass transition point described above, the substrate may be a laminate having a layer formed using a material having the glass transition point and a layer formed using a material that does not have a glass transition point. Here, in the present invention, when the release layer has a layer formed using a material that does not have a glass transition point, it is preferable that the layer formed using a material having a glass transition point be at least 80 μm thick.

[Release Substrate Properties]

Here, from the perspective of facilitating an operation for peeling the release substrate from the electrical insulating layer, the surface of the release substrate is subjected to a release treatment, such as the formation, and the like, of a release layer thereupon.

It is preferable that the release substrate also have UV absorbability. This is because, as long as the release substrate has UV absorbability, it is easy to form holes using an excimer laser, a UV laser, a UV-YAG laser, or the like. Note that "having UV absorbability" in the present invention means that light transmittance in a wavelength of 355 nm measured using a photometer for ultraviolet and visible light absorption is no more than 20%.

Additionally, although a surface roughness Ra of the release substrate is not particularly limited, it is preferably at least 1 nm but no more than 200 nm, more preferably at least 2 nm but no more than 170 nm, even more preferably at least 3 nm but no more than 150 nm, and especially preferably at least 4 nm but no more than 130 nm. If the surface roughness Ra is too small, handling properties and production efficiency can deteriorate. On the other hand, if the surface roughness Ra is too large, the surface of the electrical insulating layer will be uneven, which may make it difficult to form fine wiring on the surface of the electrical insulating layer.

[Curing Process]

In an embodiment of the method for manufacturing a multi-layer printed wiring board according to the present invention, a heating temperature when the heat-curable resin composition layer is cured by heating the laminate—provided with a substrate, a heat-curable resin composition layer provided on the substrate, and a release substrate provided on the heat-curable resin composition layer—to thus form the electrical insulating layer, having the release substrate adhered to a surface thereof, on a substrate, is a temperature capable of curing the heat-curable resin composition layer, and a temperature equal to or greater than the glass transition point of the release substrate. Note that when the heating temperature is less than the glass transition point of the release substrate material, it becomes difficult to trap the volatile component in the heat-curable resin composition layer within the layer, and thus the problem of swelling during heating is unlikely to occur.

Here, while the heating temperature may be suitably set based on the curing temperature of the heat-curable resin composition layer, the temperature is preferably at least 100° C. but no more than 250° C., more preferably at least 120° C. but no more than 220° C., and even more preferably at least 150° C. but no more than 210° C. Furthermore, heating time is typically at least 0.1 hours but no more than three hours, with at least 0.25 hours but no more than 1.5 hours being preferable. Moreover, the heating method is not particularly limited, and thus heating may be performed using, for example, an electric oven. Additionally, from the perspective of productivity, the curing process is preferably performed under atmospheric conditions.

<Formation of the Hole for the Via]

Furthermore, in an embodiment of the method for manufacturing a multi-layer printed wiring board according to the present invention, the hole for the via is formed in the electrical insulating layer formed as described above by irradiating a laser from above the release substrate before peeling the release substrate. By implementing the formation of the hole for the via using a laser before peeling the release substrate that is at least 80 μm thick from the electrical insulating layer (that is in a state where the release substrate that is at least 80 m thick is positioned over the electrical insulating layer in which the hole is formed) in this way, a hole having a small diameter and a high opening ratio (bottom diameter/opening diameter) can be formed.

While the laser here is not particularly limited, a carbon dioxide laser, an excimer laser, a UV laser, a UV-YAG laser, or the like, can be used.

Moreover, the hole to be formed can be any size and, for example, the diameter (diameter of the opening in the electrical insulating layer surface) of the hole formed in the electrical insulating layer is preferably no more than 30 μm, and more preferably no more than 25 μm. Note that the diameter of the hole is typically at least 5 μm.

Additionally, the depth of the hole to be formed can be any depth capable of connecting the desired conductive layers together.

<Removal of Smearing>

Note that in an embodiment of the method for manufacturing a multi-layer printed wiring board according to the present invention, smearing (resin residue) generated when the hole for the via is formed in the electrical insulating layer can be removed using any known means. Specifically, the smearing can be removed using any known smearing treatment method using de-smearing solutions such as permanganate solutions, ultraviolet light, plasma, and the like. Note that the de-smearing treatment can be executed before the release substrate is peeled from the electrical insulating layer (that is, in a state where a support (release substrate) is positioned over the electrical insulating layer in which the hole has been formed), or may be executed after the release substrate is peeled from the electrical insulating layer. From the perspective of suppressing any roughening of the surface of the electrical insulating layer during the de-smearing treatment, it is preferable to perform the de-smearing treatment before peeling the release substrate from the electrical insulating layer.

<Formation of a Conductor in the Hole (Formation of the Via)>

Furthermore, in forming a conductor in the hole for the via formed in the electrical insulating layer as described above, the release substrate is peeled off in cases where the release substrate has not been peeled from the surface of the electrical insulating layer, and then, after the substrate having the electrical insulating layer in which a hole has been formed at random, is washed and dried, the conductor is formed using any known method, such as a plating method, or the like. Note that, from the perspective of productivity, the formation of the conductor in the hole is preferably performed simultaneous to the formation of a conductive layer to be described in detail below.

<Formation of an Electrical Insulating Layer in which the Hole for the Via has not been Formed>

Note that in an embodiment of the method for manufacturing multi-layer printed circuit board, an electrical insulating layer other than the electrical insulating layer in which the hole for the via has been formed can be formed using any method. That is, the electrical insulating layer other than the electrical insulating layer in which the hole for the via has been formed may be formed in the same way as the electrical insulating layer in which the hole for the via has been formed with the exception that no hole is formed, may be formed without using the release substrate described above, or may be formed by curing a known curable resin composition layer.

<Conductive Layer>

Furthermore, examples of the conductive layer of the multi-layer printed wiring board include a layer including wiring formed using a conductor, such as copper, gold, or the like. Note that the conductive layer may include any type of circuit, and that the configuration, thickness, and the like, of the wiring and the circuit are not particularly limited.

<Formation of the Conductive Layer>

Furthermore, the formation of the conductive layer on the electrical insulating layer can be performed using any known method, such as a plating method, or the like. Specifically, the conductive layer can be formed on the electrical insulating layer using, for example, a fully additive method, a semi-additive method, or the like.

Note that when the hole for the via is formed in the electrical insulating layer to which the conductive layer has been laminated, it is preferable to form the conductor in the hole for the via simultaneous to the formation of the conductive layer to thus electrically connect conductive layers together through the via.

Moreover, in an embodiment of the method for manufacturing a multi-layer printed wiring board according to the present invention, by alternately repeating;

(1) the formation of the electrical insulating layer in which the hole for the via is formed, the formation of the hole for the via, smearing removal and the formation of the via, or, the formation of the electrical insulating layer in which the hole for the via has not been formed, and (2) the formation of the conductive layer on the electrical insulating layer, on the inner layer substrate formed by laminating the electrical insulating layer and the conductive layer sequentially, in that order, as described above, a multi-layer printed wiring board having a desired number of the electrical insulating layers and the conductive layers laminated together, and, at least one via can be manufactured.

EMBODIMENTS

The present invention will be described below in specific terms based on embodiment but the present invention is not limited to these embodiments. Note that, unless otherwise specified, "%'s" and "parts" expressing amounts in the following description are based on mass.

In the embodiments and the comparative examples, the thicknesses of the release substrate and the heat-curable resin composition layer, the glass transition point of the material of the release substrate, the mount of the volatile component contained in the heat-curable resin composition layer, the diameter and shape of the hole for the via formed in the electrical insulating layer, and the heat resistance of the electrical insulating layer were each measured and evaluated using the following methods.

<Thicknesses>

The thicknesses of the release substrate and the heat-curable resin composition layer were found by deriving the average of thickness values measured at five points using a film thickness gauge after opening a gap of at least 20 mm with respect to the release substrate and the heat-curable resin composition layer.

<Glass Transition Point>

A storage modulus of elasticity (E') and a loss modulus of elasticity (E") were measured for a test piece cut from the release substrate in "tension mode" using a model DMS-6100 dynamic viscoelastic analysis (DMA) device manufactured by Seiko Instruments, Inc. Note that the measurements were conducted in a range of 25° C. to 200° C. at a rate of temperature increase of 5° C. per minute. Furthermore, a value obtained by rounding off the first decimal point of the maximum value of a loss tangent (tan 6) derived from the ratio between the storage modulus of elasticity (E') and the loss modulus of elasticity (E"), obtained by the measurements, was established as the glass transition point (Tg).

<Contained Amount of the Volatile Component>

The release substrate was peeled from a heat-curable resin composition layer having a release substrate, and a weight W1 of the heat-curable resin composition layer was measured. After that, the heat-curable resin composition layer was air dried at 170° C. for 30 minutes, and a weight W2 of the dried heat-curable resin composition layer was measured. Furthermore, a ratio (={(W1−W2)/W1}×100%) of a weight reduction portion (W1−W2) with respect to the weight W1 of the heat-curable resin composition layer before drying was derived and established as the contained amount of the volatile component.

<Diameter of the Hole for the Via>

An opening diameter of the hole for the via formed in the electrical insulating layer was measured using a scanning electron microscope after the release substrate was peeled from the electrical insulating layer in which the hole for the via was formed.

<Shape of the Hole for the Via>

The opening diameter and a bottom diameter of the hole for the via formed in the electrical insulating layer was measured using a scanning electron microscope after the release substrate was peeled from the electrical insulating layer in which the hole for the via was formed. Next, an opening ratio (=(bottom diameter/opening diameter)×100%) was derived and then evaluated based on the following criteria.

○: Opening ratio is at least 65%
X: Opening ratio is less than 65%

<Heat Resistance>

The produced multilayer printed wiring board was caused to float on a 260° C. solder bath for 10 seconds. After that, the outer appearance of the multi-layer printed wiring board removed from the solder bath was observed, and then heat resistance was evaluated based on the following criteria. The fewer swellings there were, the better the heat resistance of the electrical insulating layer.

○: No swellings were observed
X: Swelling was observed in at least one location

Embodiment 1

<Preparation of the Heat-Curable Resin Composition Layer>

50 parts of a bisphenol A type epoxy compound (trade name: "jER828EL," manufactured by Mitsubishi Chemical, epoxy equivalent: 186), as an epoxy compound that is in a liquid state under normal temperature and normal pressure; 50 parts of a tetrakis hydroxyphenylethane type epoxy compound (trade name: "jER1031S," manufactured by Mitsubishi Chemical, epoxy equivalent: 200, softening point: 90° C.), as a trivalent or higher polyvalent glycidyl group-containing epoxy compound; 30 parts (15 parts in terms of a triazine structure-containing cresol novolac resin) of a cresol novolac resin containing triazine structure (trade name: PHENOLITE LA-3018-50P," a propylene glycol monomethyl ether solution with a nonvolatile content of 50% manufactured by DIC Corporation, active hydroxyl group equivalent weight: 154), as a triazine structure-containing phenolic resin; 115.3 parts (75 parts in terms of an active ester compound) of an active ester compound (trade name: "EPICLON HPC-8000-65T," a toluene solution having a nonvolatile content of 65% manufactured by DIC Corporation, active ester group equivalent weight: 223); 30 parts of a both-ends styryl group-modified polyphenylene ether compound (trade name: "OPE-2St1200," a reaction product of 2,2',3,3',5,5'-hexamethylbiphenyl-4,4'-diol.2,6-dimethylphenol polycondensate and chloromethylstyrene manufactured by Mitsubishi Gas Chemical Company, number average molecular weight (Mn)=1200, 60% toluene solution), as a polyphenylene ether compound; 670 parts of a silica (trade name: "SC2500-SXJ," manufactured by Admatechs, Inc.), as an inorganic filler; one part of a hindered phenol antioxidant (trade name: "IRGANOX (Registered Trademark) 3114," manufactured by BASF), as an antioxidant; and 110 parts of anisole were mixed, and then stirred for three minutes using a planetary stirrer. An additional 8.3 parts (or 2.5 parts in terms of 1-benzyl-2-phenylimidazole) of a solution of 1-benzyl-2-phenylimidazole dissolved in anisole to a concentration of 30%, as curing accelerator, and 0.3 parts of dicumyl peroxide (trade name: "Perkadox BC-FF," manufactured by Kayaku Akzo Corporation) were mixed, and then, the mixture was stirred for five minutes using a planetary stirrer to obtain a varnish of a heat-curable resin composition. Note that the amount of the inorganic filler contained in the varnish was 75% in terms of solid content.

<Production of the Heat-Curable Resin Composition Layer with the Release Substrate>

A wire bar was used to spread the varnish of the heat-curable resin composition obtained as described above on a polyethylene terephthalate film (a release substrate, thickness: 100 m, glass transition point: 110° C.), and then, the film was dried for four minutes at 80° C. in a nitrogen atmosphere to form a 15 μm thick heat-curable resin composition layer, made from an uncured heat-curable resin composition, on the release substrate.

Next, the amount of the volatile component contained in the heat-curable resin composition layer was measured. The results are shown in Table 1.

<Formation of the Electrical Insulating Layer>

To obtain an inner layer substrate, a conductive layer— where wiring width and distance between wires were 50 μm and thickness (wiring height) was 5 μm, and a surface of which had been micro-etched through contact with an organic acid—was formed on a surface of a 0.8 mm thick, 160 mm square (height: 160 mm, width: 160 mm) substrate clad with copper on both sides, formed by pasting 18 μm thick copper to a surface of a core material obtained by impregnating glass fibers with a varnish containing a glass filler and a halogen-free epoxy compound.

The heat-curable resin composition layer with the release substrate attached, obtained as described above, was cut into 150 mm squares, which were pasted to both surfaces of the inner layer substrate, with the release substrate attached and the surfaces on the heat-curable resin composition layer side facing inward. Next, using a vacuum laminator provided with upper and lower press plates made of heat resistant rubber, pressure was reduced to 200 Pa, and then, the heat-curable resin composition layer with the release substrate attached was laminated onto the inner layer substrate by being heat crimped thereupon for 60 seconds at a temperature of 110° C. and a pressure of 0.1 MPa. Next, the heat-curable resin composition layer was cured by being left to sit for 30 minutes at room temperature, raised in temperature from 30° C. to 180° C. (5° C. per minute) in air, and then heated again for 30 minutes at 180° C., to thus form a curable resin layer (electrical insulating layer) on the inner layer substrate.

<Formation of the Hole for the Via]

Next, prior to peeling the release substrate from the electrical insulating layer, a carbon dioxide gas laser beam device (trade name: "YB-HCS301T13," manufactured by Panasonic Welding Systems, Co., Ltd.) was used to irradiate three shots from a carbon dioxide gas laser onto the electrical insulating layers formed on both sides of the inner layer substrate and the release substrates on the electrical insulating layers from above the release substrates at a pulse width of 45 μs and energy of 0.25 mJ. The hole for the via was then formed in the electrical insulating layers. After that, the release substrates were peeled from the electrical insulating layers in which the hole for the via was formed, and the diameter and shape of the hole formed in the electrical insulating layers was evaluated. The results are shown in Table 1.

<Production of the Multi-Layer Printed Wiring Board>

A substrate, made from the electrical insulating layer in which the hole for the via was formed and the release substrate, was immersed and shaken for 15 minutes in a 60° C. aqueous solution prepared so that a swelling solution (Swelling Dip SECURIGANTH P, manufactured by Atotech, Inc., "SECURIGANTH" is a registered trademark) concentration was 500 mL/L, and a sodium hydroxide concentration was 3 g/L, subjected to a swelling treatment, and then washed with water.

Next, an aqueous solution, prepared by adding water to a mixture of 500 mL of an aqueous solution of permanganate ("Concentrate Compact CP," manufactured by Atotech, Inc.) and 40 g of sodium hydroxide until at total of 1 L of the solution was prepared, was heated to 80° C., and then, the substrate was immersed and shaken in this aqueous solution for 20 minutes, subjected to a roughening treatment, and then washed with water.

Next, the substrate was immersed for five minutes in a 40° C. aqueous solution prepared so that an aqueous solution of hydroxylamine sulfate ("Reduction SECURIGANTH P500," manufactured by Atotech, Inc., "SECURIGANTH" is a registered trademark) concentration was 100 mL/L, and a sulfuric acid concentration was 35 mL/L, subjected to a neutralization reduction treatment, and then washed with water.

Next, the substrate was immersed for five minutes in a 50° C. aqueous solution prepared so that a cleaning and conditioning aqueous solution ("ALCUP MCC-6-A," manufactured by Uyemura & Co., Ltd., "ALCUP" is a registered trademark) concentration was 50 mL/L, to perform a cleaning and conditioning treatment. Next, the substrate was washed with water by being immersed for one minute in 40° C. wash water.

Next, the substrate was immersed for two minutes in an aqueous solution prepared so that a sulfuric acid concentration was 100 g/L and a sodium sulfate concentration was 100 g/L, subjected to a soft etching treatment, and then washed with water.

Next, the substrate was immersed for one minute in an aqueous solution prepared so that a sulfuric acid concentration was 100 g/L, subjected to a pickling treatment, and then washed with water.

Next, the substrate was immersed for 5 minutes in a 60° C. plating catalyst aqueous solution containing Pd salt prepared so that an ALCUP Activator MAT-1-A (trade name, manufactured by Uyemura & Co., Ltd., "ALCUP" is a registered trademark) concentration was 200 mL/L, an ALCUP Activator MAT-1-B (trade name, manufactured by Uyemura & Co., Ltd., "ALCUP" is a registered trademark) concentration was 30 mL/L, and a sodium hydroxide concentration was 0.35 g/L, and then washed with water.

Next, the substrate was immersed for three minutes at 35° C. in an aqueous solution prepared so that an ALCUP Reducer MAB-4-A (trade name, manufactured by Uyemura & Co., Ltd., "ALCUP" is a registered trademark) concentration was 20 mL/L, an ALCUP Reducer MAB-4-B (trade name, manufactured by Uyemura & Co., Ltd., "ALCUP" is a registered trademark) concentration was 200 mL/L, subjected to a plating catalyst reduction treatment, and then washed with water.

Next, the substrate was immersed for one minute at 25° C. in an aqueous solution prepared so that an ALCUP Accelerator MEL-3-A (trade name, manufactured by Uyemura & Co., Ltd., "ALCUP" is a registered trademark) concentration was 50 mL/L.

Next, the substrate obtained by being subject to the process described above was immersed for 20 minutes at a temperature of 36° C., while air was being blown in, in an electroless copper plating solution prepared so that a Thru-Cup PEA-6-A (trade name, manufactured by Uyemura & Co., Ltd) concentration was 100 mL/L, a Thru-Cup PEA- 6-B-2X (trade name, manufactured by Uyemura & Co., Ltd., "Thru-Cup" is a registered trademark) concentration was 50 mL/L, a Thru-Cup PEA-6-D (trade name, manufactured by Uyemura & Co., Ltd) concentration was 15 mL/L, a Thru-Cup PEA-6-E (trade name, manufactured by Uyemura & Co., Ltd) concentration was 50 mL/L, and a 37% formalin aqueous solution concentration was 5 mL/L, and then subjected to an electroless copper plating treatment to form an electroless plating film on the surface and in the hole of the substrate. Next, the substrate was subjected to an annealing treatment for 30 minutes at 150° C. under an air atmosphere.

The substrate that was subjected to the annealing treatment was subjected to electrolytic copper plating to form a 30 µm thick electrolytic copper plating film thereupon. Next, the substrate upon which the electrolytic copper plating film had been formed was subject to a heat treatment for 90 minutes at 190° C. to form a conductive layer on the substrate, and to thus obtain a multi-layer printed wiring board. Next, the heat resistance of the electrical insulating layer was evaluated using the multi-layer printed wiring board. The results are shown in Table 1.

Embodiment 2

Except that the heat-curable resin composition layer formed on the release substrate was formed to a thickness of 25 µm, a heat-curable resin composition layer with a release substrate attached, an electrical insulating layer, and a multi-layer printed wiring board were produced in the same way as in Embodiment 1. Next, evaluations were performed in the same way as in Embodiment 1. The results are shown in Table 1.

Comparative Example 1

Except that drying time was changed to two minutes when the varnish on the heat-curable resin composition layer was applied to the release substrate, a heat-curable resin composition layer with a release substrate attached, an electrical insulating layer, and a multi-layer printed wiring board were produced in the same way as in Embodiment 1. Next, evaluations were performed in the same way as in Embodiment 1. The results are shown in Table 1.

Comparative Example 2

Except that the release substrate was formed to a thickness of 38 µm, a heat-curable resin composition layer with a release substrate attached, an electrical insulating layer, and a multi-layer printed wiring board were produced in the same way as in Embodiment 1. Next, evaluations were performed in the same way as in Embodiment 1. The results are shown in Table 1.

TABLE 1

| | | Embodiment 1 | Embodiment 2 | Comparative Example 1 | Comparative Example 2 |
|---|---|---|---|---|---|
| Heat-curable resin composition layer | Volatile component contained amount [wt %] | 5.5 | 5.5 | 9.0 | 5.5 |
| | Thickness [µm] | 15 | 25 | 15 | 15 |
| Release substrate | Thickness [µm] | 100 | 100 | 100 | 38 |
| | Glass transition point [° C.] | 110 | 110 | 110 | 110 |
| Electrical insulating layer | Curing temperature [° C.] | 180 | 180 | 180 | 180 |
| | Hole opening diameter [µm] | 15 | 30 | 15 | 45 |
| | Hole shape | ○ | ○ | ○ | x |
| | Heat resistance | ○ | ○ | x | ○ |

From Table 1, it can be seen that multi-layer printed wiring boards with electrical insulating layers having heat resistance superior to that of Comparative Example 1, the heat-curable resin composition layer of which contains a large amount of the volatile component, can be obtained with Embodiments 1 and 2. It can also be seen that a diameter of a hole for a via can be made smaller with Embodiments 1 and 2 than with Comparative Example 2, which used a thin release substrate. Additionally, it can be seen that a hole with a better shape than that of Embodiment 2 can be formed with Embodiment 1, which used a thin heat-curable resin composition layer.

INDUSTRIAL APPLICABILITY

According to the present invention, a small, high-density multi-layer printed wiring board can be manufactured because a hole for a via having a small diameter can be formed while suppressing a drop in a heat resistance of an electrical insulating layer.

What is claimed is:

1. A method for manufacturing a multi-layer printed circuit board having a via, comprising:
   an operation for forming an electrical insulating layer by heating a laminate provided with a substrate, a heat-curable resin composition layer provided on the substrate, and a release substrate provided on the heat-curable resin composition layer, and curing the heat-curable resin composition layer;
   and an operation for forming a hole for a via in the electrical insulating layer by irradiating a laser from above the release substrate,
   wherein,
   the release substrate is at least 80 µm thick and is formed using a material having a glass transition temperature,
   the heat-curable resin composition layer contains no more than 7.0 wt % of a volatile component and is no more than 25 µm thick,
   and the curing of the heat-curable resin composition layer occurs at a temperature that is equal to or greater than the glass transition temperature.

2. The method for manufacturing a multi-layer printed wiring board according to claim 1, wherein the heat-curable resin composition layer includes an epoxy resin, and the epoxy resin includes an epoxy compound that is in a liquid state under normal temperature and of normal pressure at a ratio of at least 20 wt %.

3. The method for manufacturing a multi-layer printed wiring board according to claim 1, wherein the heat-curable resin composition layer includes at least 50 wt % of an inorganic filler.

4. The method for manufacturing a multi-layer printed wiring board according to claim 1, wherein the heat-curable resin composition layer includes a polyphenylene ether compound.

5. The method for manufacturing a multi-layer printed wiring board according to claim 1, wherein a diameter of the hole formed in the electrical insulating layer is no more than 30 μm.

* * * * *